United States Patent
Pugliano et al.

(10) Patent No.: US 7,157,212 B2
(45) Date of Patent: Jan. 2, 2007

(54) OPTICAL COMPONENT FORMATION METHOD

(75) Inventors: Nicola Pugliano, Grafton, MA (US); Craig S. Allen, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 10/939,526

(22) Filed: Sep. 13, 2004

(65) Prior Publication Data
US 2005/0123862 A1    Jun. 9, 2005

Related U.S. Application Data

(60) Provisional application No. 60/502,767, filed on Sep. 12, 2003.

(51) Int. Cl.
*G02B 1/138*     (2006.01)
(52) U.S. Cl. .................................. 430/321; 430/290
(58) Field of Classification Search ............... None
See application file for complete search history.

(56) References Cited

U.S. PATENT DOCUMENTS

| 6,081,632 | A | 6/2000 | Yoshimura et al. | |
| 6,387,593 | B1 | 5/2002 | Kewitsch et al. | |
| 2002/0006586 | A1 | 1/2002 | Xu et al. | |
| 2002/0162360 | A1 | 11/2002 | Schaffer et al. | |
| 2002/0172492 | A1* | 11/2002 | Shelnut et al. | 385/143 |
| 2003/0139484 | A1 | 7/2003 | Bentsen et al. | |
| 2004/0105652 | A1* | 6/2004 | Shelnut et al. | 385/143 |

FOREIGN PATENT DOCUMENTS

| EP | 1 251 155 A | 10/2002 | |
| WO | WO 01/96915 | * | 12/2001 |
| WO | WO 01/96917 | * | 12/2001 |
| WO | WO 02/08828 A2 | | 1/2002 |
| WO | WO 02/16070 A2 | | 2/2002 |

OTHER PUBLICATIONS

European Search Report of corresponding European Application No. 04255232.3-1234.
Serbin et al.; "Three-dimentional nanostructuring by two-photon polymerisation of hybrid materials"; Proceedings of the SPIE, vol. 5118, Apr. 2003, pp. 571-576.
Streppel et al.; "New Wafer-Scale Fabrication Method for Stacked Optical Waveguide Interconnects and 3D micro-optic structures using photoresponsive (inorganic-organic hybrid) polymers"; Optical Materials, Elsevier Science Publishers B.V. Amsterdam, NL vol. 21, No. 1-3, Jan. 2003, pp. 475-483.
Zhou et al.; "An Efficient Two-Photon-Generated Photoacid Applied to Positive-Tone 3D Microfabrication"; Science; vol. 296; May 10, 2002; pp. 1106-1109.

* cited by examiner

*Primary Examiner*—John A. McPherson
(74) *Attorney, Agent, or Firm*—Jonathan D. Baskin

(57) ABSTRACT

Provided are methods of forming optical components. The methods involves (a) forming over a substrate a layer of a photoimageable composition that includes a hybrid organic-inorganic polymer and a photoactive component, wherein the layer has a first index of refraction and a first dissolution rate; and (b) exposing by multi-photon absorption using actinic radiation a predefined volume of the layer. The volume is caused to have: (i) a second index of refraction which is different than the first index of refraction and/or (ii) a second dissolution rate which is different than the first dissolution rate. The methods have particular applicability in the formation of optical waveguides and other optical components.

17 Claims, 4 Drawing Sheets

OPTICAL COMPONENT FORMATION METHOD

CROSS-REFERENCE TO RELATED APPLICATIONS

This application claims the benefit under 35 U.S.C. § 119(e) of U.S. Provisional Application No. 60/502,767, filed Sep. 12, 2003, the entire contents of which are incorporated herein by reference.

BACKGROUND OF THE INVENTION

1. Field of the Invention

The present invention relates generally to the field of optical components. In particular, the present invention relates to methods of forming optical components, for example, waveguides, filters, optical interconnects, lenses, diffraction gratings, and other elements, using multi-photon absorption.

2. Description of the Related Art

Signal transmission using pulse sequences of light is becoming increasingly important in high-speed communications over length scales of from 0.01 to 1 meter. For example, optical integrated circuits (OICs) are gaining importance for high bandwidth optical interconnects on printed wiring boards. As a result, the integration of optical components such as waveguides, filters, optical interconnects, lenses, diffraction gratings, and the like, onto printed wiring boards (PWBs) is becoming increasingly important.

Optical waveguides are typically constructed by surrounding a core material with a clad layer. Optical radiation propagates in the core material because the clad layer has a lower index of refraction than the core material. This condition satisfies the requirements for total internal reflection within the core. Waveguides may be used individually or as an array supported on a substrate. The waveguides often perform a passive function on the optical radiation. For example, splitters divide an optical signal in one waveguide into two or more waveguides; couplers add an optical signal from two or more waveguides into a smaller number of waveguides; and wavelength division multiplexing ("WDM") structures separate an input optical signal into spectrally discrete output signals, each of which couples to separate waveguides, usually by employing either phase array designs or gratings. Spectral filters, polarizers, and isolators may be incorporated into the waveguide design. As well, waveguides may alternatively contain active functionality, wherein the input signal is altered by interaction with a second optical or electrical signal. Exemplary active functionality includes amplification and switching such as with electro-optic, thermo-optic or acousto-optic devices.

Known methods of manufacturing optical waveguides include, for example, manually placing glass fibers into hollowed out areas on a substrate; filling a mold of a desired structure with a polymeric material that is thermally cured and later removed from the mold; and depositing an optical material on a substrate and patterning using reactive ion etching (RIE) processes. Each of these processes has drawbacks, however, such as requiring multiple steps to define the waveguide, potential sidewall roughness issues, limited resolution, incompatibility with PWB manufacturing schemes and high labor costs.

The use of photoimageable materials in forming optical components such as planar waveguides has also been proposed. In the case of planar waveguides, for example, a photoimageable core layer is deposited over a first clad layer. The core layer is then patterned using standard uv exposure and standard development techniques, and a second clad layer is deposited over the first clad layer and the patterned core structure. This process allows for further reduction in the number of processing steps over the aforementioned techniques.

International publication number WO 01/96917 A2 discloses the use of multiphoton-induced photopolymerization methods for fabricating optically functional elements. Imagewise multiphoton polymerization and blanket irradiation techniques are combined to fabricate optical elements in situ in an encapsulating, protective monolithic polymeric matrix. Various examples of suitable photopolymerizable groups are disclosed, with acryl and (meth)acryl, free radically polymerizable moieties being specified as most preferred.

There are, however, various drawbacks associated with the use of acrylates in forming optical components. For example, acrylates are generally not suitable for use in high temperature applications, for example, in chip-to-chip applications. At temperatures approaching 200° C., most acrylate materials begin to decompose and depolymerize, giving rise to reliability problems in the form, for example, of degradation in optical performance. Moreover, acrylates suffer from the disadvantage of being structurally and optically dissimilar to glass. Glass, being the current material of choice for optical fibers' and pigtail structures, provides beneficial structural and optical properties. In order to reduce problems associated with optical loss, it is desirable to employ materials for optical components having properties more closely matching those of glass than do acrylates.

There is thus a need in the optoelectronics industry for improved methods of forming optical components, as well as for optical components and electronic devices formed therefrom.

SUMMARY OF THE INVENTION

The present invention provides methods of forming optical components in which a photoimageable composition comprising a hybrid organic-inorganic polymer is imaged by multi-photon exposure. The polymer provides flexibility in processing as the resulting components have tailorable optical and mechanical properties. In accordance with one aspect of the invention, methods of forming an optical component are provided. The methods involve: (a) forming over a substrate a layer of a photoimageable composition comprising a hybrid organic-inorganic polymer and a photoactive component, wherein the layer has a first index of refraction and a first dissolution rate; and (b) exposing by multi-photon absorption using actinic radiation a predefined volume of the layer, thereby causing the volume to have: (i) a second index of refraction which is different than the first index of refraction and/or (ii) a second dissolution rate which is different than the first dissolution rate.

In accordance with a further aspect of the invention, a method of forming an optical waveguide is provided. The method comprising: (a) forming over a substrate a layer of a photoimageable composition comprising a hybrid organic-inorganic polysilsesquioxane and a photoactive component, wherein the layer has a first index of refraction and a first dissolution rate; and (b) imagewise exposing by multi-photon absorption using actinic radiation a predefined volume of the layer, thereby causing the volume to have: (i) a second index of refraction which is different than the first index of refraction and/or (ii) a second dissolution rate which is different than the first dissolution rate, wherein the exposed volume of the layer forms a waveguide core.

Other objects and aspects of the present invention will become apparent to one of ordinary skill in the art on a review of the specification, drawings and claims appended hereto.

BRIEF DESCRIPTION OF THE DRAWINGS

The present invention will be discussed with reference to the following drawings, in which like reference numerals denote like features, and in which.

DETAILED DESCRIPTION OF THE INVENTION

The present invention provides methods of forming optical components, such as optical waveguides, filters, interconnects, lenses, diffraction gratings, and the like. Unless otherwise specified, amounts of components of waveguide core and cladding compositions are provided in weight % based on the composition absent any solvent. As used herein, the term "polymer" includes oligomers, dimers, trimers, tetramers and the like, and encompasses polymers formed from one or more types of monomer units. The term "alkyl" includes linear, branched and cyclic alkyl. The term aromatic includes carbocycles and heterocycles. The terms "halogen" and "halo" include fluorine, chlorine, bromine, and iodine. Thus the term "halogenated" refers to fluorinated, chlorinated, brominated, and iodinated. The terms "a" and "an" mean one or more.

Figure 1:
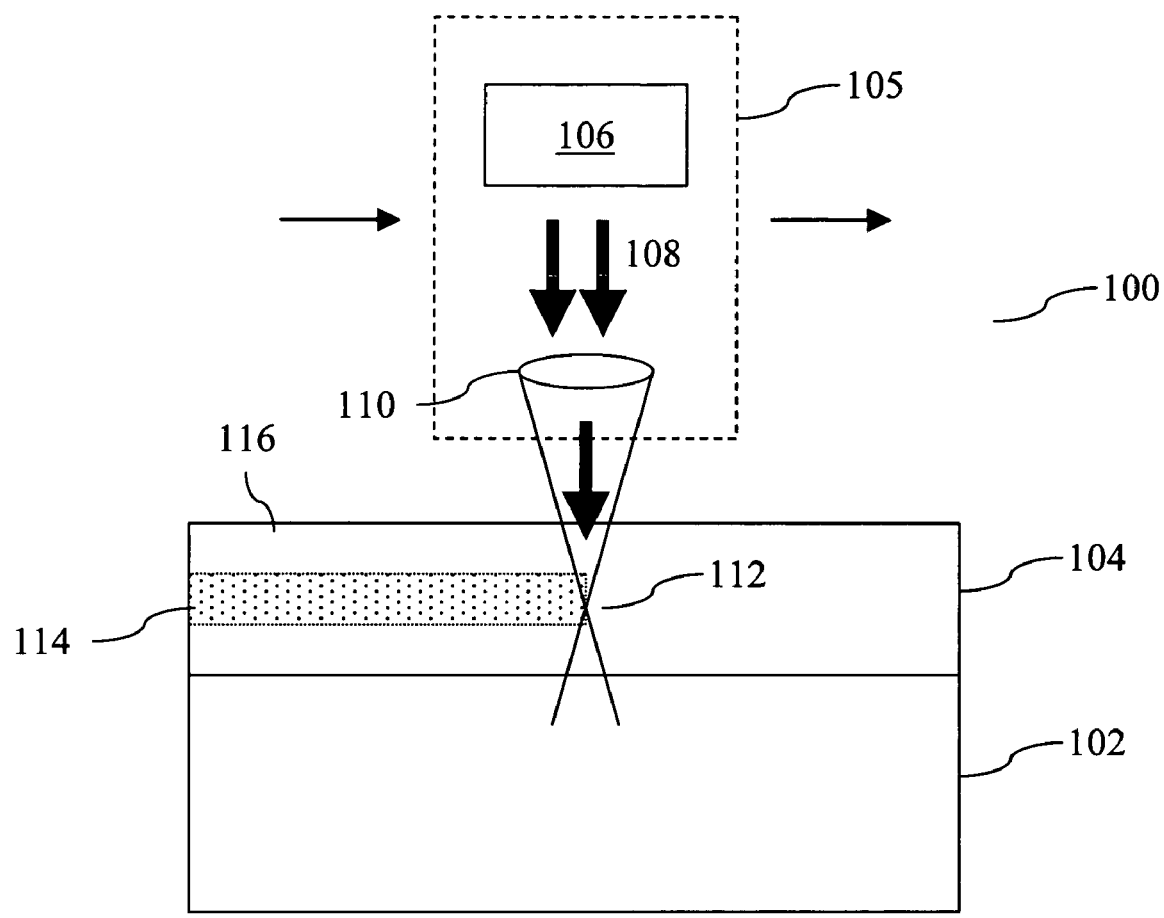
FIG. 1 illustrates an exemplary system which can be used to practice methods in accordance with the invention.

The present invention will now be described with reference to FIG. 1, which illustrates an exemplary system 100 which can be used to practice methods in accordance with a first aspect of the invention. The methods allow for the preparation of optical components by direct imaging of a photoimageable hybrid organic-inorganic polymer. The optical components formed in accordance with the present invention may be manufactured individually or as a plurality of components.

A substrate 102 is provided. Any substrate suitable for supporting the photoimageable layer and the optical component formed in the layer may be used. Suitable substrates include, but are not limited to, substrates used in the manufacture of electronic devices such as printed wiring boards and integrated circuits. Particularly suitable substrates include laminate surfaces and copper surfaces of copper clad boards, printed wiring board inner layers and outer layers, wafers used in the manufacture of integrated circuits such as silicon, gallium arsenide, and indium phosphide wafers, glass substrates including but not limited to liquid crystal display ("LCD") glass substrates, dielectric coatings, silicon oxides, silicon nitrides, silicon oxynitrides, sapphires, epoxy laminates, polyimides, polysiloxanes, cladding layers, and the like. For example, if the optical component to be formed is an optical waveguide, the substrate may optionally include a cladding layer, although the methods of the invention allow for formation of core and cladding from a single layer.

A layer 104 of a photoimageable composition having a first index of refraction is deposited over the substrate 102. The photoimageable composition includes a hybrid organic-inorganic polymer and a photoactive component. The use of hybrid polymers is advantageous in that mechanical and optical properties of the formed optical components can be tailored. Suitable hybrid organic-inorganic polymers include, for example, hybrid organic-inorganic silicon-containing materials such as polysilsesquioxanes and polysiloxanes, and hybrid organic-inorganic polymers containing zirconium, aluminum, germanium, titanium, and combinations thereof. Such silicon-containing materials have the added benefit in that glass-like properties, such as those related to optical, thermal and mechanical properties, can be achieved, thus providing desirable optical loss characteristics and a high decomposition temperature, making them particularly suitable for optical component manufacture as well as high temperature applications thereof.

The polymeric compounds may be unsubstituted or substituted, for example, with deuterium or one or more halogens. Suitable hybrid silsesquioxane polymers include, for example, POSS (Polyhedral Oligomeric Silsesquioxane)-based polymers, and those described in co-pending U.S. application Ser. No. 10/307,904 and in published U.S. application No. 20020172492 A1, the entire contents of which applications are incorporated herein by reference. The silsesquioxane polymers include polymerized units of the formula $(RSiO_{1.5})$, wherein R is a substituted or unsubstituted organic side chain group. The side chain group may include or be free of hydroxy groups. Exemplary R groups include substituted and unsubstituted alkyl, aryl, alkenyl, alkynyl, aralkyl, acrylate groups, and combinations thereof. Of these, alkyl and aryl groups are typical. Alkyl groups can be straight chain, branched or cyclic having, for example, from 1 to 20 carbon atoms, such as methyl, ethyl, n-propyl, isopropyl, t-butyl, t-amyl, t-octyl, decyl, dodecyl, cetyl, stearyl, cyclohexyl, norbornyl, adamantyl and 2-ethylhexyl. Exemplary aryl groups include those having from 6 to 20, typically from 6 to 15, carbon atoms, such as phenyl, tolyl, 1-naphthyl, 2-naphthyl and 2-phenanthryl.

The polymer can be a silsesquioxane homopolymer, in which case the silsesquioxane polymers are formed from a single type of polymerized unit of the formula $(RSiO_{1.5})$ and have the general theoretical formula $(RSiO_{1.5})_n$, wherein R is as described above, and n is an integer greater than zero. Exemplary silsesquioxane homopolymers include alkyl silsesquioxanes such as methyl silsesquioxane, ethyl silsesquioxane, propyl silsesquioxane, n-butyl silsesquioxane, isobutyl silsesquioxane, tert-butyl silsesquioxane, and the like, and aryl silsesquioxanes such as phenyl silsesquioxane and tolyl silsesquioxane.

Alternatively, the polymer can take the form of a copolymer, either a random- or block-type. The copolymer can be, for example, a combination of two or more different types of silisesquioxane units with the proportions for each unit ranging from 1 to 99 mole %. The silsesquioxane copolymer can include polymerized units of the formula $(R^1SiO_{1.5})$ and $(R^2SiO_{1.5})$, wherein $R^1$ and $R^2$ are different and are as described above with reference to R. The copolymer can be, for example, an alkyl/aryl silsesquioxane such as a copolymer containing methyl, ethyl, or propyl silsesquioxane and phenyl silsesquioxane or containing methyl silsesquioxane, ethyl silsesquioxane, and phenyl silsesquioxane; an alkyl silsesquioxane copolymer such as a copolymer containing methyl silsesquioxane and ethyl silsesquioxane; or an aryl silsquioxane copolymer such as a copolymer containing phenyl silsesquioxane and tolyl silsesquioxane.

The silsesquioxane-based polymer can optionally include one or more non-silsesquioxane units, in addition to the silsesquioxane units. Such non-silsesquioxane units can be, for example, polymerized units of the formula (($R^3$)$_2$SiO) or ($R^3R^4$SiO), wherein $R^3$ and $R^4$ are the same or different, and are selected from a substituted or unsubstituted organic group, such as an alkyl group, for example, methyl, ethyl, propyl, and the like, or an aryl group, for example, phenyl, tolyl, and the like. The copolymer can alternatively include a single type of silsesquioxane unit as defined above, together with one or more such polymerized non-silsesquioxane units. One or more hydrogen atoms on the side chain groups can be substituted by another substituent group, for example, deuterium, halogen such as fluorine, bromine, and chlorine, ($C_1$–$C_6$)alkyl, ($C_1$–$C_6$)haloalkyl, ($C_1$–$C_{10}$)alkoxy, ($C_1$–$C_{10}$)alkylcarbonyl, ($C_1$–$C_{10}$)alkoxycarbonyl, ($C_1$–$C_{10}$)alkylcarbonyloxy, and the like. The silsesquioxane polymers may contain a wide range of repeating units. The silsesquioxane polymers may have, for example, from 5 to 150 repeating units, typically from about 10 to 35 repeating units.

Suitable hybrid organic-inorganic siloxane polymers include those having polymerized unit of the formula (($R^3$)$_2$SiO), wherein the $R^3$ groups are the same or different and are substituted or unsubstituted organic groups, as described above with respect to the silisesquioxane-based polymers. The polymer can be a siloxane homopolymer, in which case the silsesquioxane polymers are predominantly formed from a single type of polymerized unit of the formula (($R^3$)$_2$SiO) and having the general theoretical formula (($R^3$)$_2$SiO), wherein $R^3$ is as described above, and n is an integer greater than zero. Exemplary siloxane homopolymers include alkyl siloxanes such as methyl siloxane, ethyl siloxane, propyl siloxane, n-butyl siloxane, iso-butyl siloxane, tert-butyl siloxane, and the like, and aryl siloxanes such as phenyl siloxane and tolyl siloxane.

The polymer can further take the form of a siloxane-based copolymer, either a random- or block-type. The copolymer can be, for example, a combination of two or more different types of siloxane units with the proportions for each unit ranging from 1 to 99 mole %. The siloxane copolymer can, for example, include polymerized units of the formula (($R^4$)$_2$SiO) and (($R^5$)$_2$SiO), wherein $R^4$ and $R^5$ are different and are as described above with reference to $R^3$. The siloxane-based copolymer can be, for example, an alkyl/aryl siloxane such as a copolymer containing methyl siloxane and phenyl siloxane or containing methyl siloxane, ethyl siloxane, and phenyl siloxane; an alkyl siloxane copolymer such as a copolymer containing methyl siloxane and ethyl siloxane; or an aryl siloxane copolymer such as a copolymer containing phenyl siloxane and tolyl siloxane.

Typically, the polymers have a weight average molecular weight ($M_w$) of 500 or more, for example, from about 500 to 25,000, from about 1000 to 10,000 and from about 1000 to 5000. The polymers can further include two or more functional end groups that allow condensation polymerization to occur. Such end groups can be, for example, hydroxy, alkoxy such as ethoxy, propoxy, isopropoxy, carboxyester, amino, amido, epoxy, imino, carboxyacid, anhydride, olefinic, acrylic, acetal, orthoester, vinyl ether, and combinations thereof.

A photoactive component is also present in the photoimageable composition to alter the refractive index of the above-described polymeric, constituent compounds upon multi-photon exposure. The photoactive component catalyzes coupling of exposed portions of the constituent compound, thereby effecting a change in the index of refraction of the polymeric material. A wide variety of photoactive components may be used in the present invention, including, but not limited to, photoacid generators, photobase generators and photoinitiators.

The photoacid generators useful in the present invention can be any compound or compounds which liberate acid upon exposure to light. Suitable photoacid generators are known and include, but are not limited to, halogenated triazines, halogenated oxadiazoles, onium salts, sulfonated esters, substituted hydroxyimides, substituted hydroxylimines, azides, naphthoquinones such as diazonaphthoquinones, diazo compounds, and combinations thereof.

Particularly useful halogenated triazines include, for example, halogenated alkyl triazines such as the halomethyl-s-triazines. The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924–30 (1969). Other triazine type photoacid generators useful in the present invention are disclosed, for example, in U.S. Pat. No. 5,366,846, the entire contents of which are herein incorporated by reference.

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to, diazonium salts such as diaryl-diazonium salts and onium salts of group VA and B, IIA and B and I of the Periodic Table, for example, halonium salts such as iodonium salts, quaternary ammonium, phosphonium and arsonium salts, sulphonium salts such as aromatic sulfonium salts, for example, phenyl sulfonium salts such as napthlyene and anthracene, sulfoxonium salts or selenium salts. Examples of suitable onium salts are disclosed, for example, in U.S. Pat. Nos. 4,442,197; 4,603,101; and 4,624,912, the entire contents of which patents are incorporated herein by reference. Sulfonium salts such as triphenylsulfonium hexafluorophosphates and mixtures thereof are preferred.

The sulfonated esters useful as photoacid generators in the present invention include, for example, sulfonyloxy ketones. Suitable sulfonated esters include, but are not limited to, benzoin tosylate, t-butylphenyl alpha-(p-toluenesulfonyloxy)-acetate, 2,6-dinitrobenzyl tosylate, and t-butyl alpha-(p-toluenesulfonyloxy)-acetate. Such sulfonated esters are disclosed, for example, in the *Journal of Photopolymer Science and Technology*, vol. 4, No. 3,337–340 (1991), the entire contents of which are incorporated herein by reference.

Substituted hydroxyimides which can be used include, for example, n-trifluoromethylsulfonyloxy-2,3-diphenylmaleimide and 2-trifluoromethylbenzenesulfonyloxy-2,3-diphenylmaleimide. Suitable substituted hydroxylimines include, for example, 2-(-nitrilo-2-methylbenzylidene)-(5-hydroxy-iminobutylsulfonyl)-thiophene. Azides useful in the present invention include, for example, 2,6-(4-azidobenzylidene) cyclohexanone. Naphthoquinones can include, for example, 2,1-diazonaphthoquinone-4-sulfonate ester of 2,3,4-trihydroxybenzophenone. Among the diazo compounds, 1,7-bis (4-chlorosulonyl phenyl)-4-diazo-3,5-heptanedione can be used.

Photobase generators useful in the present invention can be any compound or compounds which liberate base upon exposure to light. Suitable photobase generators include, but are not limited to, benzyl carbamates, benzoin carbamates, O-carbamoylhydroxyamines, O-carbamoyloximes, aromatic sulfonamides, alpha-lactams, N-(2-allylethenyl)amides, arylazide compounds, N-arylformamides, 4-(ortho-nitrophenyl)dihydropyridines, and combinations thereof.

Photoinitiators can be used, for example, where an unsaturated side group, such as an acrylic group, is present. Suitable photoinitiators, compounds which generate free-radicals, include, for example, azo compounds, sulfur containing compounds, metallic salts and complexes, oximes, amines, polynuclear compounds, organic carbonyl compounds and mixtures thereof as described in U.S. Pat. No. 4,343,885, column 13, line 26 to column 17, line 18, the disclosure of which is incorporated by reference herein; and 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthoquinone; 9,10-phenanthrenequinone; 1,2-benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone; 2,3-diphenylanthraquinone; 3-chloro-2-methylanthraquinone; retenequinone; 7,8,9,10-tetrahydronaphthalenequinone; and 1,2,3,4-tetrahydrobenz (a)anthracene-7,12-dione. Other photoactive components which are also useful are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-allylbenzoin, and alpha-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; benzophenone, 2,4,5-triphenylimidazolyl dimers with hydrogen donors, and mixtures thereof as described in U.S. Pat. Nos. 3,427,161; 3,479,185; and 3,549,367 can be also used as photoinitiators. Also useful with photoinitiators and photo-inhibitors are sensitizers as disclosed in U.S. Pat. No. 4,162,162. Though, not a free-radical generator, triphenylphosphine may be included in the photoactive chemical system as a catalyst.

The amount of photoactive component useful in the present invention is any amount sufficient to bring about a change in the index of refraction ($\Delta n$) of the hybrid organic-inorganic polymer upon exposure to multi-photon radiation sufficient for the component to function for its intended purpose. Exposure may result in an increase or decrease in the refractive index. Where the refractive index increases after exposure, a +$\Delta n$ results, whereas a decrease results in a −$\Delta n$. While the amount of the photoactive component will depend on the specific photoactive component and polymer, the photoactive component is typically present in the composition in an amount of from 0.1 to 25 wt %, more typically from 0.1 to 12 wt %.

One or more flexibilizer can optionally be included in the composition to impart a desired amount of flexibility to the components formed. It may, for example, be beneficial to add a flexibilizer to compositions used in forming relatively thick coatings, such as those on the order of three or more microns, which have an increased susceptibility to the formation of cracks. While the particular flexibilizer selected will depend on the other components of the composition, typical flexibilizer materials include, for example, polysiloxanes and plasticizers such as long chain alkyds. Typically, the flexibilizer has two or more groups in its chain that are capable of coupling with the constituent compound. Preferred such groups include hydroxy, alkoxy, carboxyester, amino, amido, epoxy, imino, carboxyacid, anhydride, olefinic, acrylic, acetal, orthoester, vinyl ether, and combinations thereof. Of these groups, hydroxy is particularly preferred. Exemplary polysiloxane flexibilizer materials include polysiloxanes terminated with functional groups such as silanol-terminated polydiphenylsiloxanes and silanol-terminated polydimethylsiloxanes, typically in which the end groups consist only of functional groups or flexible silsesquioxane polymers, for example, those formed from reacting 33 wt % methyl-triethoxy-silane, 33 wt % phenyl-triethoxy-silane, and 33 wt % dimethyl(dialkyl)-diethoxy-silane. The flexibilizer is typically present in the composition in an amount of less than 30 wt %, more specifically less than 20 wt %.

Other additives may optionally be present in the photoimageable compositions of the invention including, but not limited to, surface leveling agents, for example silicone-base oils such as SILWET L-7604 silicone-base oil available from GE Silicones, wetting agents, antifoam agents, adhesion promoters, thixotropic agents, and the like. Such additives are well known in the art for coating compositions. It will be appreciated that more than one additive may be combined in the photoimageable compositions. For example, a wetting agent may be combined with a thixotropic agent. Such optional additives are commercially available from a variety of sources. The amounts of such optional additives to be used will depend on the particular additive and desired effect, and are within the ability of those skilled in the art. Such other additives are typically present in the photoimageable composition in an amount of less than 5 wt %, more specifically less than 2.5 wt %.

The photoimageable compositions can optionally contain one or more organic cross-linking agent. Cross-linking agents include, for example, materials which link up components of the composition in a three-dimensional manner. Any aromatic or aliphatic cross-linking agent that reacts with the constituent component is suitable for use in the present invention. Such organic cross-linking agents will cure to form a polymerized network with the constituent component, and reduce solubility (increase dissolution rate) in a developer solution and bring about a change in the index of refraction of the composition. Such organic cross-linking agents may be monomers or polymers. It will be appreciated by those skilled in the art that combinations of cross-linking agents may be used successfully in the present invention.

Suitable organic cross-linking agents useful in the present invention include, but are not limited to: amine containing compounds, epoxy containing materials, compounds containing at least two vinyl ether groups, allyl substituted aromatic compounds, glycourils, and combinations thereof. Preferred cross-linking agents include amine containing compounds and epoxy containing materials.

The amine containing compounds useful as cross-linking agents in the present invention include, but are not limited to: a melamine monomers, melamine polymers, alkylolmethyl melamines, benzoguanamine resins, benzoguanamine-formaldehyde resins, urea-formaldehyde resins, glycouril-formaldehyde resins, and combinations thereof.

Epoxy containing materials useful as cross-linkers in the present invention are any organic compounds having one or more oxirane ring that are polymerizable by ring opening.

The photoimageable compositions may suitably comprise only a single type of organic cross-linker, for example, only an amine containing cross-linker, or may contain two or more different cross-linkers. It will be appreciated by those skilled in the art that suitable organic cross-linker concentrations will vary with factors such as cross-linker reactivity and specific application of the composition. When used, the cross-linking agent(s) is typically present in the composition in an amount of from 0.1 to 50 wt %, more specifically from 0.5 to 25 wt %, and even more specifically from 1 to 20 wt %.

The photoimageable compositions can optionally contain one or more solvent. Such solvents aid in formulating the compositions and in coating the present compositions on a substrate. A wide variety of solvents may be used. Suitable solvents include, but are not limited to, glycol ethers, such as ethylene glycol monomethyl ether, propylene glycol monomethyl ether, dipropylene glycol monomethyl ether; esters such asmethyl cellosolve acetate, ethyl cellosolve acetate, propylene glycol monomethyl ether acetate, dipropylene glycol monomethyl ether acetate, dibasic esters, carbonates such as propylene carbonate, γ-butyrolactone, esters such as ethyl lactate, n-amyl acetate and n-butyl acetate, alcohols such as n-propanol, iso-propanol, ketones such as cyclohexanone, methyl isobutyl ketone, diisobutyl ketone and 2-heptanone, lactones such as γ-butyrolactone and ε-caprolactone, ethers such as diphenyl ether and anisole, hydrocarbons such as mesitylene, toluene and xylene, and heterocyclic compounds such as N-methyl-2-pyrrolidone, N,N'-dimethylpropyleneurea, or mixtures thereof.

The photoimageable composition can be deposited by any technique, for example, screen printing, curtain coating, roller coating, slot coating, spin coating, flood coating, electrostatic spray, spray coating, or dip coating. When the composition is spray coated, a heated spray gun may optionally be used. The viscosity of the composition may be adjusted to meet the requirements for each method of application by viscosity modifiers, thixotropic agents, fillers and the like. Typically, the layer is coated to a thickness of from about 1 to 200 μm, more typically from about 1 to 100 μm, still more typically 2 to 80 μm, and still more typically from about 5 to 64 μm.

The coated substrate is typically then dried to remove any solvent in the coating. The drying can be conducted, for example, in an oven such as an infrared oven, a convection oven, a convection/conduction oven, a vacuum oven, or on a hot plate. Such drying may take place at various temperatures and times, depending upon the particular solvent chosen and the drying technique. Suitable temperatures are any that are sufficient to substantially remove any solvent present. Typically, the drying may be at any temperature from room temperature (25° C.) to 170° C. and at a time of from 5 seconds to 120 minutes. When using an oven, typical times are from 10 to 120 minutes and from 10 seconds to 10 minutes for a hot plate.

After drying, a predefined portion of the photoimageable layer 104 is imaged by exposure to radiation using the multi-photon absorption system 100. Multiphoton absorption imaging systems and techniques are known to those skilled in the art, and are described, for example, in international publication numbers WO 01/96917 A2 and WO 02/16070 A2, and U.S. Pat. No. 6,081,632, the entire content of which documents being incorporated herein by reference.

Figure 2:
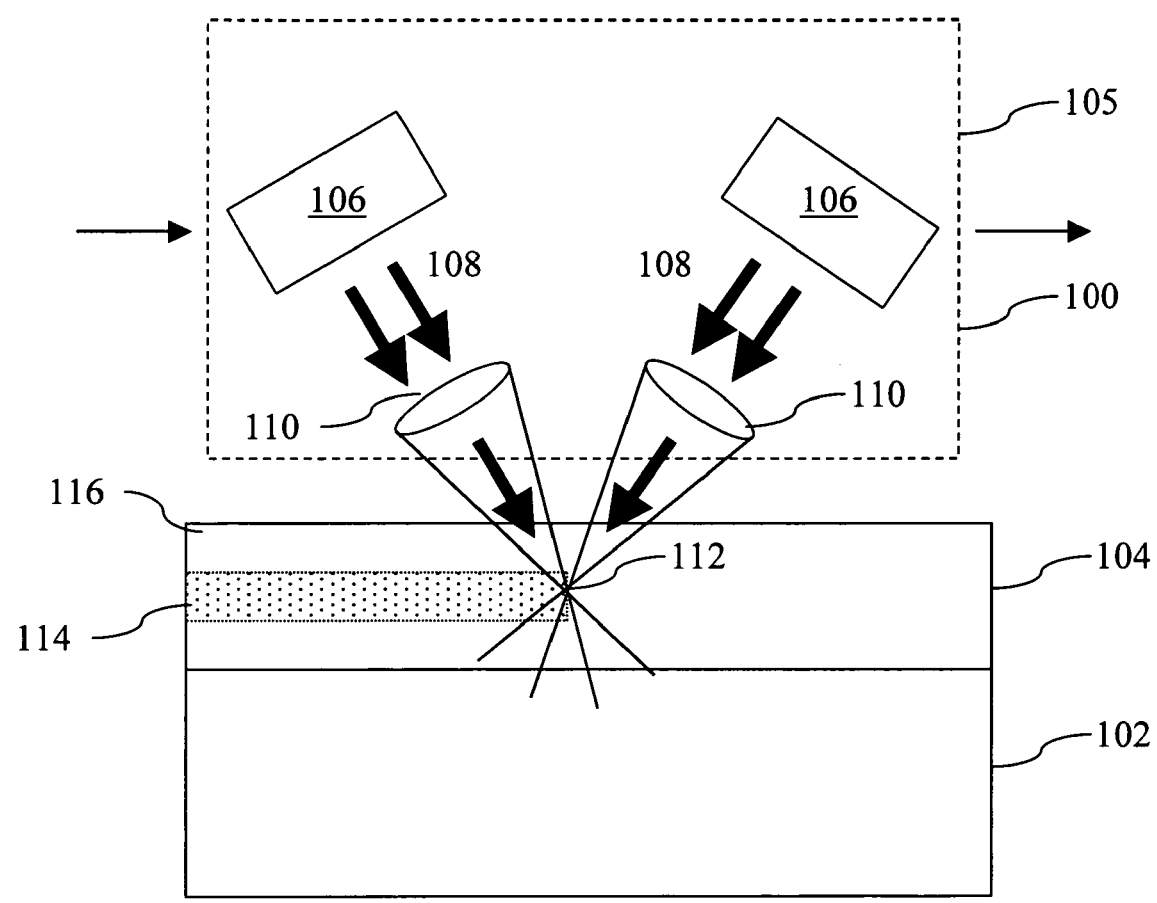
FIG. 2 illustrates a further exemplary system which can be used to practice methods in accordance with the invention.

The system 100 includes one or more exposure system 105 that includes a light source 106, a focusing lens 110, and optionally other optical elements, for example, mirrors and additional lenses. The light source 106, typically one or more laser light source, generates actinic radiation 108 that passes through the focusing lens 110 and into the photoimageable layer 104 with a focal point 112 at a desired position within the layer. Where a plurality of light sources 106 are employed (see FIG. 2), the exposed volume is defined by the spatial and temporal overlap of the radiation in the photoimageable layer. The same effect achieved with a plurality of light sources can be attained by splitting the radiation from a single light source. In this way, light having the same or different characteristics such as power density, polarization, frequency and temporal compression of pulses can be attained by appropriate manipulation of the split radiation.

The characteristics of the radiation is such that multiphoton absorption occurs in the vicinity of the focal point and generally not outside of that area. In this way, the refractive index of the layer in the area of the focal point becomes altered as compared to the unexposed layer material. As described above, depending on the specific composition of the photoimageable layer, the change in refractive index of the exposed portion of the layer may be positive (+Δn) or negative (−Δn) with respect to the original material. This characteristic will determine which portions of the photoimageable layer are to be exposed.

Suitable light sources are known in the art and include, for example, femtosecond titanium sapphire lasers, argon ion-pumped lasers, colliding-pulse mode-locked lasers, and amplified versions thereof operating at frequencies of, for example, 1 to 10 kHz. Such lasers are commercially available, for example, from Spectra-Physics.

The relative position of the focal point 112 within the photoimageable layer 104 can be varied in all directions during the exposure step such that a predefined volume of the photoimageable material that will define one or more optical components is exposed. This can be achieved, for example, by movement of the focal point 112 within the photoimageable layer while holding the substrate in a fixed position as illustrated (see arrows), by movement of the substrate while maintaining the focal point in a fixed position, or by a combination thereof. A plurality of exposure systems 105 can be used to achieve this effect. As illustrated in the exemplary embodiment, the focal point 112 is scanned from left to right across the photoimageable layer 104. This forms a region 114 having an index of refraction different from that in region 116. In the case of an optical waveguide, for example, the region 114 would correspond to a waveguide core while the region 116 would define a clad, with the index of refraction of the core region 114 being greater than that in the clad region 116.

Persons skilled in the art can readily select suitable conditions, for example, pulse energy per square unit of area (Ep), pulse duration, intensity, exposure time, scan rate, in conducting multiphoton polymerization in accordance with the invention. The setting of such variables will depend, for example, on the specific composition of the photoimageable layer 104, and particularly the photoactive component type and concentration.

Following exposure, the imaged layer 104 can be partially cured, typically at a temperature of from 40° to 300° C. Curing time may vary but is generally from about 30 seconds to about 1 hour. This step can further alter the refractive index of the imaged volume as compared to the unexposed areas of the layer. The optical component may, at this stage be in final form. Optionally, additional processing such as formation of one or more additional layers over the photoimageable layer may be carried out. The methods in accordance with the invention allow for formation of optical components without the need for additional steps of developing the imaged layer and formation of additional layers different in refractive index from the optical component.

Figure 3:
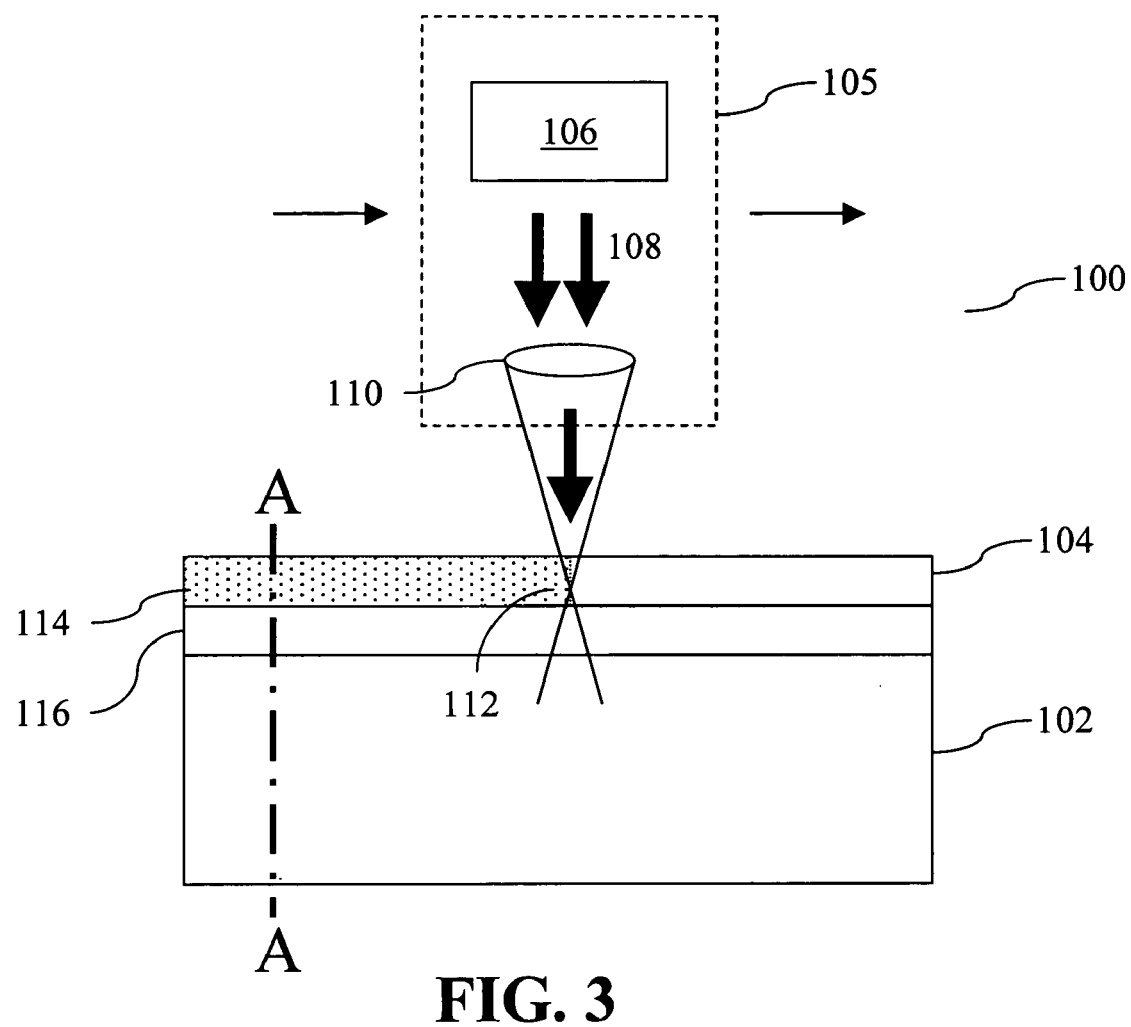
FIG. 3 illustrates a further exemplary system which can be used to practice methods in accordance with the invention.
Figure 4A:
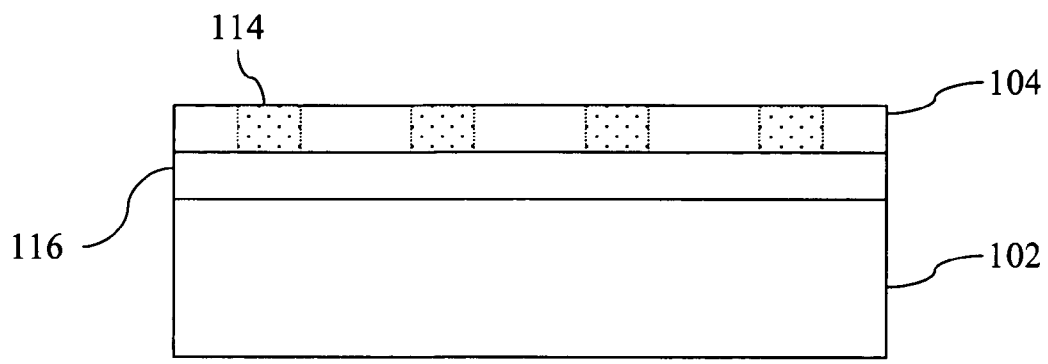
FIGS. 4A–C illustrate in cross-section an optical waveguide at various stages of formation thereof, in accordance with the invention.
Figure 4B:
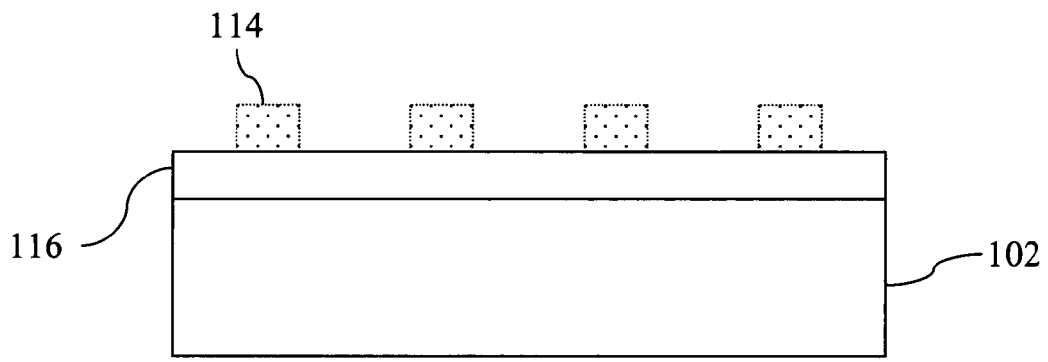
Figure 4C:
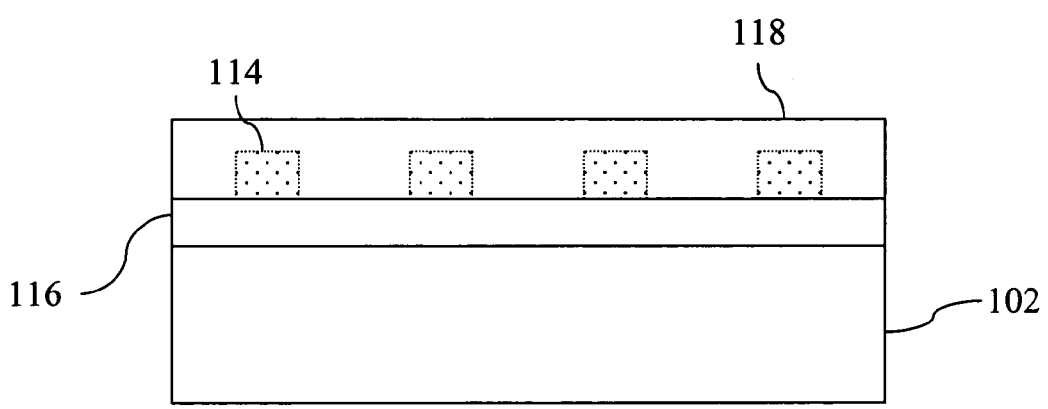

FIG. 3 illustrates a further aspect of the invention in which the methods involve development of the photoimageable layer 104 in forming an optical component. In this exemplary embodiment, the optical component to be formed is an optical waveguide. FIG. 3 illustrates a further exemplary system which can be used to practice methods in accordance with the invention. FIGS. 4A–C illustrate, in cross-section along plane A—A of FIG. 3, an optical waveguide at various stages of formation thereof.

A first cladding layer 116 is formed over the substrate 102. Suitable materials for the cladding include, for example, any of the materials described above with respect to the photoimageable layer with or without the photoimageable components, and other materials known to those skilled in the art. The first cladding layer 116 can be coated using any of the techniques described above with reference to photoimageable layer. Typically, the first cladding layer 116 is coated to a thickness of from about 1 to 200 μm, for example, from about 1 to 100 μm, for example, from about 10 to 50 μm.

The first cladding layer may be cured, for example, thermally and/or photolytically. Typically, the thermal curing temperature is from 130° C. to 300° C. and occurs over a period of from five seconds to one hour using, for example, an oven or hot plate. Additionally or alternatively to the thermal treatment, the waveguide can be flood exposed, for example, with 1 to 2 Joules/cm$^2$ of actinic radiation.

A layer 104 of a photodefinable composition as described above is deposited over the first cladding layer 116. The composition forming the waveguide core should result in a core material having an index of refraction greater than that of the cladding material. The photoactive component is effective to alter the dissolution rate of the above-described constituent compounds in a developer upon exposure to actinic radiation. While various types of developer solutions may be employed, the change in dissolution rate is measured in reference to a 0.7 N NaOH developer solution. The value of the dissolution rates for exposed compared with unexposed regions can differ, for example, by greater than a factor of two, by greater than a factor of 50, by greater than a factor of 100, by greater than a factor of 200, by greater than a factor of 500, by greater than a factor of 1000, by greater than a factor of 5000, or by greater than a factor of 10,000. Typically, the photoimageable layer 104 is deposited to a thickness of from about 1 to 100 μm, for example, from about 5 to 50 μm.

The photoimageable layer 104 is typically dried and then imaged by multiphoton absorption as described above, as shown in FIG. 3 and FIG. 4A. The dissolution rate of the layer 104 in the area of the focal point becomes altered as compared to the unexposed layer material. In the case of a negative-acting material, the core pattern is the exposed region which becomes less soluble in a developer than the unexposed regions, while in the case of a positive-acting material, the core pattern is the unexposed region and the dissolution rate of the exposed regions are rendered soluble in the developer solution. Following exposure, the composition can be partially cured as described above. The cure may further alter the dissolution rate of the waveguide core pattern as compared to the other areas of the core layer such that the other areas can be removed in a developer solution without removing the core pattern.

The unexposed areas in the case of a negative-working material or exposed areas in the case of a positive-acting material may be removed, such as by contact with a suitable developer, leaving one or more waveguide core structure 114 as shown in FIG. 4B. While the specific type of developer will depend on the material of the photoimageable layer, use of aqueous-based or solvent-based developers is envisioned. Suitable aqueous-based developers include, for example, alkali metal hydroxides such as sodium hydroxide and potassium hydroxide in water, as well as tetraalkylammonium hydroxide such as tetramethylammonium hydroxide, in water. Such developers are typically used in concentrations from 0.1 to 2N, more specifically 0.15 to 1N, even more specifically 0.26 to 0.7N. The developer solutions may optionally include one or more known surfactant, such as polyethylene glycol, alkyl sulfonates, and other surfactants well known in the art. The surfactant is typically present in the developer in an amount of from 0.5 to 3 wt %. Suitable solvent-based developers include, for example, alcohols such as ethanol, isopropyl alcohol, ketones, such as acetone, methyl isobutyl ketone, esters, such as ethyl acetate, and propylene glycol monomethyl ether acetate. Other suitable solvents are known to those skilled in the art. Development may take place at a variety of temperatures such as from room temperature to about 50° C.

A second cladding layer 118 can be formed over the first cladding layer 116 and core structures 114, as shown in FIG. 4C. Suitable materials for the second cladding layer 118 include, for example, any of the materials described above with respect to the first cladding layer. The second cladding layer 118 may be of the same or a different material from the first cladding layer 116. However, the indices of refraction of the first and second cladding layers should be approximately the same. The second cladding layer is then thermally cured and/or photo-exposed to provide a waveguide structure. The description above with respect to curing of the first cladding layer applies to the second cladding layer as well. The second cladding layer is deposited to a thickness sufficient to cover the waveguide core structures. This thickness is typically from about 2 to 150 μm. Optical components in accordance with the invention are thus formed.

While the invention has been described in detail with reference to specific embodiments thereof, it will be apparent to one skilled in the art that various changes and modifications can be made, and equivalents employed, without departing from the scope of the claims.

What is claimed is:

1. A method of forming an optical component, comprising;
    (a) forming over a substrate a layer of a photoimageable composition comprising a hybrid organic-inorganic polymer comprising polymerized units of the formula ($RSiO_{1.5}$), wherein R is a substituted or unsubstituted organic side chain group, and a photoactive component, wherein the layer has a first index of refraction and a first dissolution rate; and
    (b) exposing by multi-photon absorption using actinic radiation a predefined volume of the layer, thereby causing the volume to have: (i) a second index of refraction which is different than the first index of refraction and/or (ii) a second dissolution rate which is different than the first dissolution rate.

2. The method of claim 1, wherein the hybrid organic-inorganic polymer comprises polymerized units of the formula ($R_1SiO_{1.5}$) and ($R^2SiO_{1.5}$), wherein $R^1$ and $R^2$ are different and are substituted or unsubstituted organic side chain groups.

3. The method of claim 2, wherein one of $R^1$ and $R^2$ is a substituted or unsubstituted aromatic group and the other of $R^1$ and $R^2$ is a substituted or unsubstituted aliphatic group.

4. The method of claim 3, wherein one of $R^1$ and $R^2$ is a phenyl group and the other of $R^1$ and $R^2$ is a methyl group.

5. The method of claim 3, wherein the hybrid organic-inorganic polymer further comprises a polymerized unit of the formula $((R^3)_2SiO)$, wherein the $R^3$ groups are the same or different and are substituted or unsubstituted organic groups.

6. The method of claim 1, wherein the hybrid organic-inorganic polymer further comprises a polymerized unit of the formula $((R^3)_2SiO)$, wherein the $R^3$ groups are the same or different and are substituted or unsubstituted organic groups.

7. The method of claim 1, wherein the photoactive component comprises a photoacid or a photobase generator.

8. The method of claim 1, wherein the multi-photon absorption comprises two-photon absorption.

9. The method of claim 1, wherein the actinic radiation is one or more selected from visible and near infrared radiation.

10. The method of claim 1, wherein the actinic radiation is generated by a laser.

11. The method of claim 10, wherein the laser generates the actinic radiation as a series of pulses.

12. The method of claim 10, wherein the actinic radiation is generated by a plurality of laser beams.

13. The method of claim 1, wherein the method is a development-free process.

14. The method of claim 1, further comprising developing the exposed substrate with an aqueous base developer.

15. A method of forming an optical waveguide, comprising:

(a) forming over a substrate a layer of a photoimageable composition comprising a hybrid organic-inorganic polymer comprising polymerized units of the formula $(RSiO_{1.5})$, wherein R is a substituted or unsubstituted organic side chain group, and a photoactive component, wherein the layer has a first index of refraction and a first dissolution rate; and (b) exposing by multi-photon absorption using actinic radiation a predefined volume of the layer, thereby causing the volume to have: (i) a second index of refraction which is different than the first index of refraction and/or (ii) a second dissolution rate which is different than the first dissolution rate, wherein the exposed volume of the layer forms a waveguide core.

16. The method of claim 15, wherein the method is a development-free process.

17. The method of claim 15, further comprising developing the exposed substrate with an aqueous base developer.

* * * * *